(12) United States Patent
Shabbir et al.

(10) Patent No.: US 10,712,790 B2
(45) Date of Patent: Jul. 14, 2020

(54) SYSTEMS AND METHODS FOR REDUCING TEMPERATURE CYCLING RISK ON AN INFORMATION HANDLING RESOURCE

(71) Applicant: Dell Products L.P., Round Rock, TX (US)

(72) Inventors: Hasnain Shabbir, Round Rock, TX (US); Donald L. Petersen, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 75 days.

(21) Appl. No.: 16/054,131

(22) Filed: Aug. 3, 2018

(65) Prior Publication Data

US 2020/0042056 A1 Feb. 6, 2020

(51) Int. Cl.
*G06F 1/20* (2006.01)
*H05K 7/20* (2006.01)
*G05B 15/02* (2006.01)

(52) U.S. Cl.
CPC ............. *G06F 1/206* (2013.01); *G05B 15/02* (2013.01); *H05K 7/20154* (2013.01); *H05K 7/20209* (2013.01); *H05K 7/20336* (2013.01)

(58) Field of Classification Search
CPC .......................... G06F 1/206; H05K 7/20336; H05K 7/20209; H05K 7/20154; G05B 15/02
See application file for complete search history.

(56) References Cited

U.S. PATENT DOCUMENTS

2015/0373876 A1* 12/2015 Berke .................... G05B 15/02
700/282

* cited by examiner

*Primary Examiner* — Chun Cao
(74) *Attorney, Agent, or Firm* — Jackson Walker L.L.P.

(57) ABSTRACT

In accordance with embodiments of the present disclosure, an information handling system may include a circuit board, a device communicatively coupled to the circuit board via an electrical interface, a temperature sensor for sensing a measured temperature associated with the device, an air mover, a heating element thermally coupled to the electrical interface, and a thermal control system. The thermal control system may be configured to receive a temperature signal from the temperature sensor indicative of the measured temperature, responsive to the measured temperature being above a maximum threshold temperature, control the air mover to generate airflow sufficient to at least reduce the measured temperature to below the maximum threshold temperature, and responsive to the measured temperature being below a minimum threshold temperature, control the heating element to cause the measured temperature to be maintained above the minimum threshold temperature.

15 Claims, 2 Drawing Sheets

SYSTEMS AND METHODS FOR REDUCING TEMPERATURE CYCLING RISK ON AN INFORMATION HANDLING RESOURCE

TECHNICAL FIELD

The present disclosure relates in general to information handling systems, and more particularly to reducing temperature cycling risk on an information handling resource.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

While it is often desirable to maintain a thermal control system such that all components of an information handling system each operate below a respective maximum temperature, such thermal control in existing systems may lead to large temperature swings of certain components. For example, when active, a component may have a high temperature but may be maintained under its respective maximum temperature by the thermal control system. When idle, the temperature of the component may drop to a much lower value, due to collateral cooling as the thermal control system maintains other components below their respective maximum temperatures.

Such thermal fluctuations may cause thermal stress in components. For example, such thermal fluctuations can lead to repeated thermal expansion and contraction of electrical connections associated with a component, such as solder joints between the component and a printed circuit board. Over time, such repeated expansion and contraction may lead to decreased reliability of such electrical connections.

SUMMARY

In accordance with the teachings of the present disclosure, the disadvantages and problems associated with reduced information handling resource reliability due to temperature cycling may be substantially reduced or eliminated.

In accordance with embodiments of the present disclosure, an information handling system may include a circuit board, a device communicatively coupled to the circuit board via an electrical interface, a temperature sensor for sensing a measured temperature associated with the device, an air mover, a heating element thermally coupled to the electrical interface, and a thermal control system. The thermal control system may be configured to receive a temperature signal from the temperature sensor indicative of the measured temperature, responsive to the measured temperature being above a maximum threshold temperature, control the air mover to generate airflow sufficient to at least reduce the measured temperature to below the maximum threshold temperature, and responsive to the measured temperature being below a minimum threshold temperature, control the heating element to cause the measured temperature to be maintained above the minimum threshold temperature.

In accordance with these and other embodiments of the present disclosure, a method may include receiving a temperature signal from a temperature sensor indicative of a measured temperature associated with a device, responsive to the measured temperature being above a maximum threshold temperature, controlling an air mover to generate airflow sufficient to at least reduce the measured temperature to below the maximum threshold temperature, and responsive to the measured temperature being below a minimum threshold temperature, controlling a heating element thermally coupled to an electrical interface between the device and a circuit board in order to cause the measured temperature to be maintained above the minimum threshold temperature.

In accordance with these and other embodiments of the present disclosure, an article of manufacture may include a non-transitory computer-readable medium and computer-executable instructions carried on the computer-readable medium, the instructions readable by a processor, the instructions, when read and executed, for causing the processor to: receive a temperature signal from a temperature sensor indicative of a measured temperature associated with a device; responsive to the measured temperature being above a maximum threshold temperature, control an air mover to generate airflow sufficient to at least reduce the measured temperature to below the maximum threshold temperature; and responsive to the measured temperature being below a minimum threshold temperature, control a heating element thermally coupled to an electrical interface between the device and a circuit board in order to cause the measured temperature to be maintained above the minimum threshold temperature.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
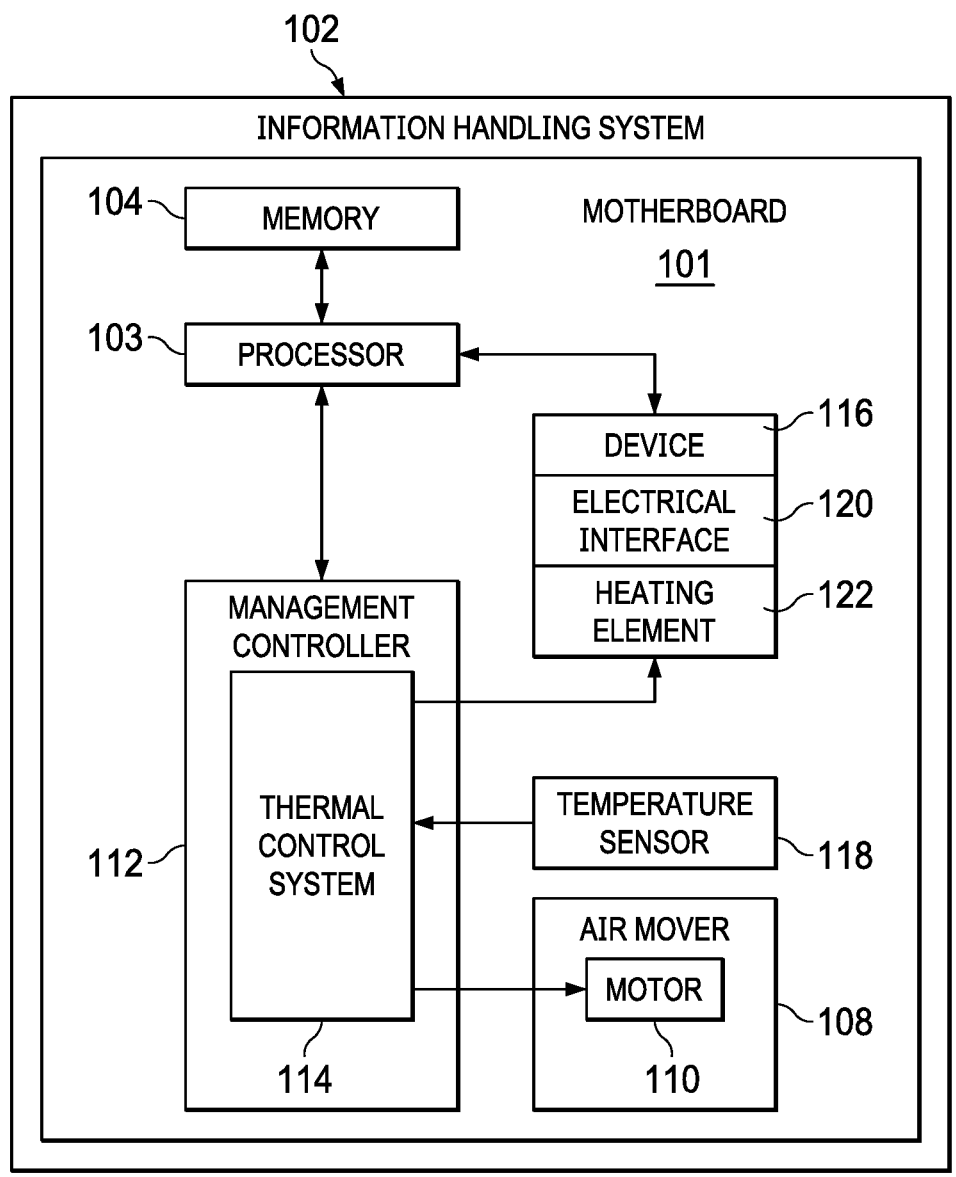
FIG. 1 illustrates a block diagram of an example information handling system, in accordance with the present disclosure.
Figure 2:
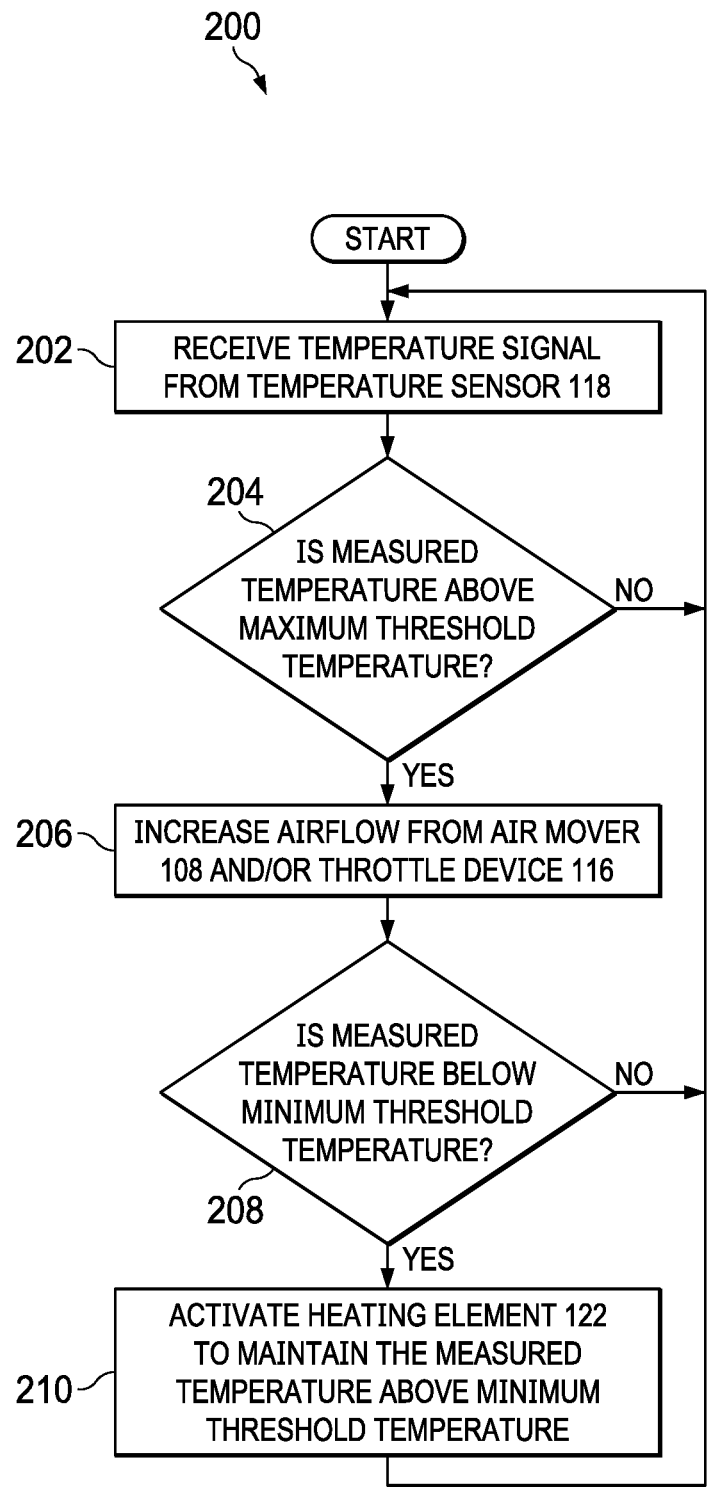
FIG. 2 illustrates a flow chart of an example method for reducing temperature cycling risk on an information handling resource, in accordance with the present disclosure.

Preferred embodiments and their advantages are best understood by reference to FIGS. 1 and 2, wherein like numbers are used to indicate like and corresponding parts. For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

FIG. 1 illustrates a block diagram of an example of an information handling system 102. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As depicted, information handling system 102 may include a motherboard 101 and one or more other information handling resources.

Motherboard 101 may include a circuit board configured to provide structural support for one or more information handling resources of information handling system 102 and/or electrically couple one or more of such information handling resources to each other and/or to other electric or electronic components external to information handling system 102. As shown in FIG. 1, motherboard 101 may include a processor 103, a memory 104, an air mover 108, a management controller 112, a device 116, a temperature sensor 118, an electrical interface 120, and a heating element 122.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Air mover 108 may include any mechanical or electromechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by an air mover control signal (e.g., a pulse-width modulation signal) communicated from thermal control system 114 of management controller 112. In operation, air mover 108 may cool information handling resources of information handling system 102 by drawing cool air into an enclosure housing the information handling resources from outside the chassis, expelling warm air from inside the enclosure to the outside of such enclosure, and/or moving air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., a signal from temperature sensor 118), and based on such signals, control thermal conditions within information handling system 102. For example, based on temperature signals, thermal control system 114 may calculate an air mover driving signal (e.g., a pulse-width modulation signal) to maintain an appropriate level of cooling, increase cooling, or decrease cooling, as appropriate, and communicate such air mover driving signal to air mover 108. As another example, based on temperature signals, thermal control system 114 may generate a heating element control signal to cause heating element 122 to generate heat, as described in greater detail below. In some embodiments, thermal control system 114 may include a program of instructions (e.g., software, firmware) configured to, when executed by a processor or controller integral to management controller 112, carry out the functionality of thermal control system 114. The functionality of thermal control system 114 may be described in greater detail below with respect to FIG. 2.

Device 116 may comprise any suitable information handling resource communicatively coupled to processor 103. For example, in some embodiments, device 116 may comprise a graphics processing unit.

Temperature sensor 118 may be any system, device, or apparatus (e.g., a thermometer, thermistor, etc.) configured to communicate a signal to thermal control system 114 indicative of a temperature within information handling system 102.

Electrical interface 120 may comprise any suitable system, device, or apparatus for electrically coupling device 116 to motherboard 101. Accordingly, electrical interface 120 may comprise any suitable collection and/or arrangement of electrical pins, electrical pads, solder joints, and/or other electrically conductive components.

Heating element 122 may be thermally coupled to electrical interface 120, and comprise any system, device, or apparatus for generating heat and communicating such generated heat to electrical interface 120. For example, heating element 122 may comprise programmable heating elements (e.g., electrically resistive loads) under the control of thermal control system 114. To communicate heat generated by heating element 122 to electrical interface 120, heating element 122 may be thermally coupled to one or more heat pipes, heat spreaders, or other thermally-conductive components for thermally coupling electrical interface 120 to heating element 122. For example, in some embodiments, heating element 122 may comprise one or more segmented heating elements formed on a heat spreader thermally coupled to device 116 and further comprise suitable circuitry for powering on, powering off, or otherwise controlling an amount of heat generated by heating element 122. In other embodiments, heating element 122 may comprise external heater strips that may be configured (e.g., "pluggable") to mechanically fit a heat spreader thermally coupled to device 116. In yet other embodiments, heating element 122 may comprise one or more heat strips placed on a "back side" of motherboard 101 (e.g., opposite of the side to which device 116 is mounted) which may be thermally coupled to electrical interface 120 (e.g., surrounding solder attachments of device 116 onto motherboard 101) and may include strategically placed vias to allow heat conduction to device 116 or proximate to device 116 in an area to remain heated when device is in a passive state.

In addition to motherboard 101, processor 103, memory 104, air mover 108, management controller 112, device 116, temperature sensor 118, electrical interface 120, and heating element 122, information handling system 102 may include one or more other information handling resources. In addition, for the sake of clarity and exposition of the present disclosure, FIG. 1 depicts only one air mover 108, one device 116, and one temperature sensor 118. In embodiments of the present disclosure, information handling system 102 may include any number of air movers 108, devices 116, and temperature sensors 118.

In operation, temperature sensor 118 may measure a temperature proximate to device 116. To properly maintain an operating temperature of device 116 below its respective maximum operating temperature, thermal control system 114 may, for example, compare the operating temperature to a setpoint temperature associated with device 116 to determine an error; based on the error, determine an air mover speed sufficient to cool device 116 to below the maximum operating temperature; and communicate an air mover control signal to motor 110 in order to operate air mover 108 at least at the determined air mover speed.

However, when device 116 is idle or otherwise not generating significant heat, thermal control system 114 may still drive motor 110 to cool other information handling resources of information handling system 102, which may cause the operating temperature associated with device 116 to drop well below its maximum operating temperature. When device 116 again becomes active and generates heat, such operating temperature may again increase towards the maximum operating temperature. As mentioned in the Background section, such large temperature swings may cause repeated thermal expansion and contraction of components of electrical interface 120, which may lead to decreased reliability or inoperability of device 116. Accordingly, to reduce this temperature cycling risk associated with device 116, thermal control system 114 may, as needed, activate heating element 122 to maintain an operating temperature of device 116 above a minimum operating temperature, while still controlling air mover 108 to maintain adequate cooling of other information resources of information handling system 102.

FIG. 2 illustrates a flow chart of an example method 200 for reducing temperature cycling risk on an information handling resource, in accordance with the present disclosure. According to one embodiment, method 200 may begin at step 202. As noted above, teachings of the present disclosure may be implemented in a variety of configurations of information handling system 102 and/or thermal control system 114. As such, the preferred initialization point for method 200 and the order of the steps comprising method 200 may depend on the implementation chosen.

At step 202, thermal control system 114 may receive a temperature signal from temperature sensor 118 indicative of a measured temperature associated with device 116. At step 204, thermal control system 114 may determine whether the temperature is above a maximum threshold temperature. Such maximum threshold temperature may define a maximum temperature at which device 116 may operate at a desired or optimum level of performance. If the measured temperature exceeds the maximum threshold temperature, method 200 may proceed to step 206. Otherwise, method 200 may proceed to step 208.

At step 206, in response to the measured temperature exceeding the maximum threshold temperature, thermal control system 114 may take one or more actions to reduce the measured temperature to below the maximum threshold temperature. For example, the one or more actions may include increasing airflow generated by air mover 108. In addition or alternatively, the one or more actions may include causing a reduction in the heat generated by device 116, such as by throttling operation of device 116. After completion of step 206, method 200 may proceed again to step 202.

At step 208, in response to the measured temperature being below the maximum threshold temperature, thermal control system 114 may determine whether the temperature is below a minimum threshold temperature. Such minimum threshold temperature may define a minimum temperature that limits a temperature range of the operational temperature of device 116, so as to reduce temperature cycling risk associated with electrical interface 120. If the measured temperature is below the minimum threshold temperature, method 200 may proceed to step 210. Otherwise, method 200 may proceed again to step 202.

At step 210, in response to the measured temperature being below the minimum threshold temperature, thermal control system 114 may activate heating element 122 in order to maintain the measured temperature above the minimum threshold temperature, in order to reduce temperature cycling risk associated with electrical interface 120. After completion of step 210, method 200 may proceed again to step 202.

Although FIG. 2 discloses a particular number of steps to be taken with respect to method 200, method 200 may be executed with greater or lesser steps than those depicted in FIG. 2. In addition, although FIG. 2 discloses a certain order of steps to be taken with respect to method 200, the steps comprising method 200 may be completed in any suitable order.

Method 200 may be implemented using information handling system 102, thermal control system 114, or any other system operable to implement method 200. In certain embodiments, method 200 may be implemented partially or fully in software and/or firmware embodied in computer-readable media.

Although the foregoing discussion contemplates thermally coupling heating element 122 to electrical interface 120 associated with device 116, in some embodiments, heating element 122 may be coupled to an electrical interface associated with processor 103, memory 104, or another information handling resource of information handling system 102. In addition, although the foregoing discussion contemplates coupling heating element 122 to electrical interface 120 interfaced between device 116 and motherboard 101, heating element 122 may be coupled between any suitable electrical interface between any suitable information handling resource and any suitable circuit board.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
a circuit board;
a device communicatively coupled to the circuit board on a front side of the circuit board via an electrical interface;
a temperature sensor for sensing a measured temperature associated with the device;
an air mover;
a heating element thermally coupled to the electrical interface; and
a thermal control system configured to:
receive a temperature signal from the temperature sensor indicative of the measured temperature;
responsive to the measured temperature being above a maximum threshold temperature, control the air mover to generate airflow sufficient to at least reduce the measured temperature to below the maximum threshold temperature; and
responsive to the measured temperature being below a minimum threshold temperature, control the heating element to cause the measured temperature to be maintained above the minimum threshold temperature;
wherein the heating element is coupled to a back side of the circuit board, and wherein the circuit board includes one or more vias configured to transmit heat from the heating element to the device and the electrical interface.

2. The information handling system of claim 1, wherein the thermal control system is further configured to control the air mover to generate airflow sufficient to maintain a second measured temperature associated with a second device below a second maximum threshold temperature while controlling the heating element to cause the measured temperature to be maintained above the minimum threshold temperature.

3. The information handling system of claim 1, wherein the heating element is thermally coupled to the electrical interface via one or more of a heat pipe and a heat spreader thermally coupled to the device.

4. The information handling system of claim 1, wherein the heating element comprises one or more segmented heating elements formed on a heat spreader thermally coupled to the device.

5. The information handling system of claim 1, wherein the heating element comprises one or more external heater strips configured to mechanically fit a heat spreader thermally coupled to the device.

6. A method comprising:
receiving a temperature signal from a temperature sensor indicative of a measured temperature associated with a device;
responsive to the measured temperature being above a maximum threshold temperature, controlling an air mover to generate airflow sufficient to at least reduce the measured temperature to below the maximum threshold temperature; and
responsive to the measured temperature being below a minimum threshold temperature, controlling a heating element thermally coupled to an electrical interface between the device and a circuit board in order to cause the measured temperature to be maintained above the minimum threshold temperature;
wherein the device is coupled to a front side of the circuit board, and the heating element is coupled to a back side of the circuit board; and
wherein the circuit board includes one or more vias configured to transmit heat from the heating element to the device and the electrical interface.

7. The method of claim 6, further comprising controlling the air mover to generate airflow sufficient to maintain a second measured temperature associated with a second device below a second maximum threshold temperature while controlling the heating element to cause the measured temperature to be maintained above the minimum threshold temperature.

8. The method of claim 6, wherein the heating element is thermally coupled to the electrical interface via one or more of a heat pipe and a heat spreader thermally coupled to the device.

9. The method of claim 6, wherein the heating element comprises one or more segmented heating elements formed on a heat spreader thermally coupled to the device.

10. The method of claim 6, wherein the heating element comprises one or more external heater strips configured to mechanically fit a heat spreader thermally coupled to the device.

11. An article of manufacture comprising:
a non-transitory computer-readable medium; and
computer-executable instructions carried on the computer-readable medium, the instructions readable by a processor, the instructions, when read and executed, for causing the processor to:
receive a temperature signal from a temperature sensor indicative of a measured temperature associated with a device;
responsive to the measured temperature being above a maximum threshold temperature, control an air mover to generate airflow sufficient to at least reduce the measured temperature to below the maximum threshold temperature; and
responsive to the measured temperature being below a minimum threshold temperature, control a heating element thermally coupled to an electrical interface between the device and a circuit board in order to cause the measured temperature to be maintained above the minimum threshold temperature;
wherein the device is coupled to a front side of the circuit board, and the heating element is coupled to a back side of the circuit board; and
wherein the circuit board includes one or more vias configured to transmit heat from the heating element to the device and the electrical interface.

12. The article of claim 11, the instructions for further causing the air mover to generate airflow sufficient to maintain a second measured temperature associated with a second device below a second maximum threshold temperature while controlling the heating element to cause the measured temperature to be maintained above the minimum threshold temperature.

13. The article of claim 11, wherein the heating element is thermally coupled to the electrical interface via one or more of a heat pipe and a heat spreader thermally coupled to the device.

14. The article of claim 11, wherein the heating element comprises one or more segmented heating elements formed on a heat spreader thermally coupled to the device.

15. The article of claim 11, wherein the heating element comprises one or more external heater strips configured to mechanically fit a heat spreader thermally coupled to the device.

\* \* \* \* \*